US010256162B2

(12) United States Patent
Oikawa

(10) Patent No.: US 10,256,162 B2
(45) Date of Patent: Apr. 9, 2019

(54) SUBSTRATE PROCESSING SYSTEM, CONTROL DEVICE, AND SUBSTRATE PROCESSING METHOD

(71) Applicant: Tokyo Electron Limited, Tokyo (JP)

(72) Inventor: Masami Oikawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/904,609

(22) Filed: Feb. 26, 2018

(65) Prior Publication Data

US 2018/0254222 A1 Sep. 6, 2018

(30) Foreign Application Priority Data

Mar. 6, 2017 (JP) .................. 2017-041436

(51) Int. Cl.
| H01L 21/67 | (2006.01) |
| H01L 21/66 | (2006.01) |
| H01L 21/306 | (2006.01) |
| H01L 21/3065 | (2006.01) |

(52) U.S. Cl.
CPC .......... *H01L 22/12* (2013.01); *H01L 21/3065* (2013.01); *H01L 21/30604* (2013.01); *H01L 21/67069* (2013.01); *H01L 21/67109* (2013.01); *H01L 21/67253* (2013.01)

(58) Field of Classification Search
CPC . H01L 21/67; H01L 21/306; H01L 21/67069; H01L 21/30604; H01L 21/67253; H01L 21/67109

USPC .............................................. 438/5
See application file for complete search history.

(56) References Cited

U.S. PATENT DOCUMENTS

| 9,658,508 B1 * | 5/2017 | Bass ................. G02F 1/163 |
| 2008/0275584 A1 * | 11/2008 | Izumi ............... G05B 19/41865 |
| | | 700/101 |

FOREIGN PATENT DOCUMENTS

| JP | 2002-118100 A | 4/2002 |
| JP | 2012-151356 A | 8/2012 |

* cited by examiner

*Primary Examiner* — Chuong A Luu
(74) *Attorney, Agent, or Firm* — Abelman, Frayne & Schwab

(57) ABSTRACT

Disclosed is a substrate processing system capable of performing an etching processing collectively on a plurality of substrates accommodated in a processing container. The system includes: a first acquisition unit which acquires, as information, an amount of a film forming material formed on one of the substrates; a second acquisition unit which acquires, as information, the number of the substrates; a first calculating unit which calculates a total amount of the film forming material formed on the substrates based on the amount of the film forming material and the number of the substrates; and a second calculating unit which calculates an etching condition required to etch and remove the entire film forming material based on the total amount of the film forming materials and a relationship between a predetermined amount of the film forming material and an etching condition.

8 Claims, 3 Drawing Sheets

SUBSTRATE PROCESSING SYSTEM, CONTROL DEVICE, AND SUBSTRATE PROCESSING METHOD

CROSS-REFERENCE TO RELATED APPLICATION

This application is based on and claims priority from Japanese Patent Application No. 2017-041436 filed on Mar. 6, 2017 with the Japan Patent Office, the disclosure of which is incorporated herein in its entirety by reference.

TECHNICAL FIELD

The present disclosure relates to a substrate processing system, a control device, and a substrate processing method.

BACKGROUND

In the related art, there has been known a method of supplying etching gas to a wafer accommodated in a processing container, and selectively etching a silicon film formed on the wafer. For example, a gas including a halogen element such as fluorine (F) or bromine (Br) is used as the etching gas from the view point that a silicon film can be removed with a highly volatile halogen compound (see, for example, Japanese Patent Laid-Open Publication No. 2002-118100).

In a case in which the silicon film is etched using a gas containing fluorine, end point detection may be performed by monitoring the amount of $SiF_4$, which is a halogen compound produced by the etching, using a non-dispersive infrared (NDIR) sensor or the like (see, for example, Japanese Patent Laid-Open Publication No. 2012-151356).

SUMMARY

According to an aspect of the present disclosure, provided is a substrate processing system capable of performing an etching processing collectively on a plurality of substrates accommodated in a processing container by supplying an etching gas. The substrate processing system includes: a first acquisition unit configured to acquire, as information, an amount of a film forming material formed on one of the plurality of substrates; a second acquisition unit configured to acquire, as information, the number of the plurality of substrates accommodated in the processing container; a first calculating unit configured to calculate a total amount of the film forming material formed on the plurality of substrates accommodated in the processing container based on the amount of the film forming material acquired by the first acquisition unit and the number of the plurality of substrates acquired by the second acquisition unit; and a second calculating unit configured to calculate an etching condition required to etch and remove the entire film forming material based on the total amount of the film forming materials calculated by the first calculating unit and a relationship between a predetermined amount of the film forming material and an etching condition.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DESCRIPTION OF EMBODIMENT

Figure 1:
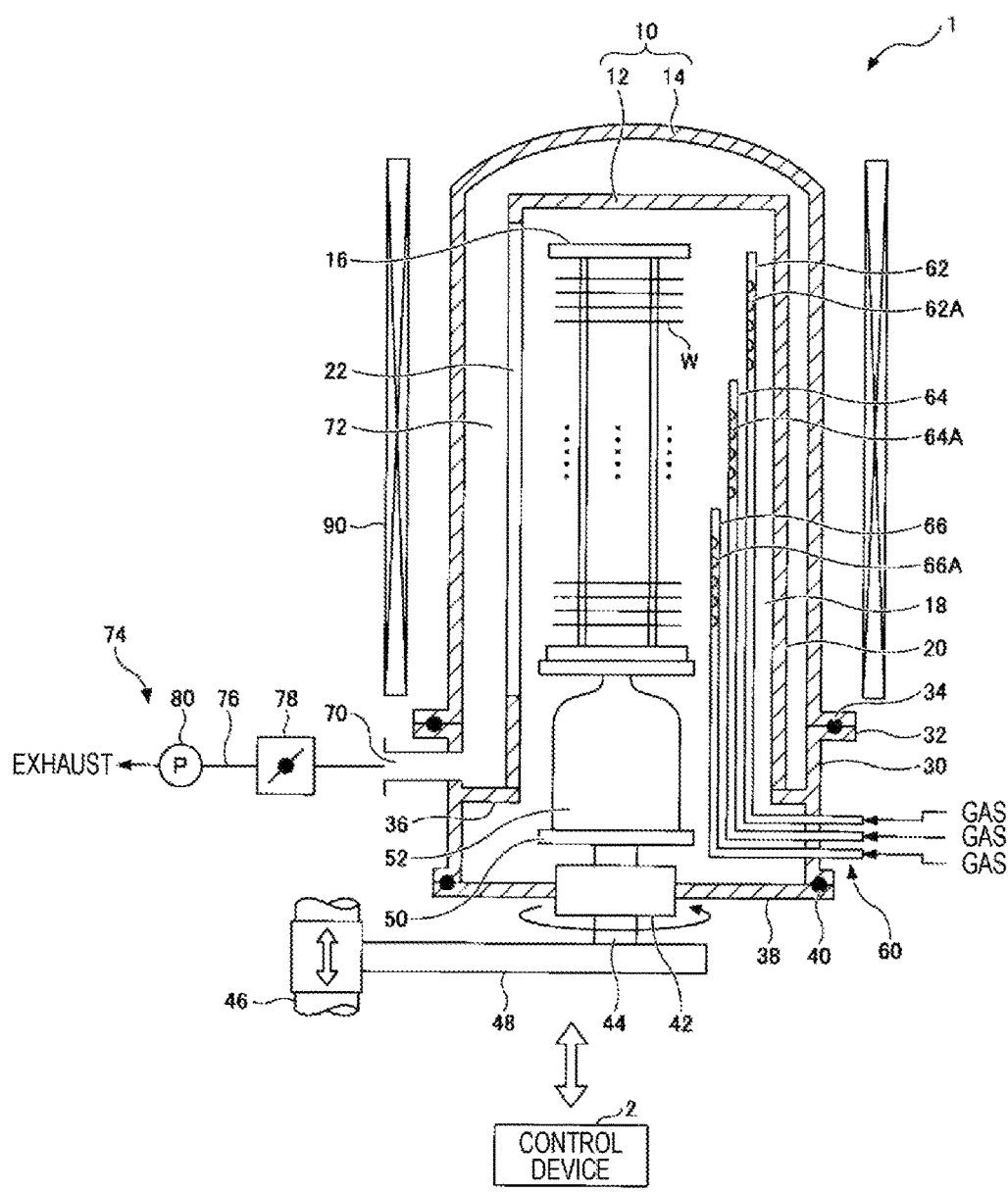
FIG. 1 is a schematic cross-sectional view of a substrate processing system according to an exemplary embodiment of the present disclosure.

In the following detailed description, reference is made to the accompanying drawings, which form a part thereof. The illustrative embodiments described in the detailed description, drawings, and claims are not meant to be limiting. Other exemplary embodiments may be utilized, and other changes may be made without departing from the spirit or scope of the subject matter presented here.

In a case in which the silicon film is etched using the gas containing bromine, end point detection cannot be performed using a sensor because a sensor capable of detecting the amount of $SiBr_4$, which is a halogen compound produced by the etching, has not been developed.

Therefore, an object of an aspect of the present disclosure is to provide a substrate processing system capable of performing end point detection of etching using a gas containing bromine.

An aspect of the present disclosure provides a substrate processing system capable of performing an etching processing collectively on a plurality of substrates accommodated in a processing container by supplying an etching gas. The substrate processing system includes: a first acquisition unit configured to acquire, as information, an amount of a film forming material formed on one of the plurality of substrates; a second acquisition unit configured to acquire, as information, the number of the plurality of substrates accommodated in the processing container; a first calculating unit configured to calculate a total amount of the film forming material formed on the plurality of substrates accommodated in the processing container based on the amount of the film forming material acquired by the first acquisition unit and the number of the plurality of substrates acquired by the second acquisition unit; and a second calculating unit configured to calculate an etching condition required to etch and remove the entire film forming material based on the total amount of the film forming materials calculated by the first calculating unit and a relationship between a predetermined amount of the film forming material and an etching condition.

In the above-described substrate processing system, the amount of the film forming material is an amount calculated based on a surface area of a substrate before the film forming material is formed on the substrate, and a film thickness of the film forming material.

In the above-described substrate processing system, the film forming material is silicon, and the etching gas is a bromine-containing gas.

In the above-described substrate processing system, the etching condition includes at least one of a gas flow rate, a processing time, a processing temperature, and a processing pressure.

An aspect of the present disclosure provides a control device that controls an operation of a substrate processing apparatus capable of performing an etching processing collectively on a plurality of substrates accommodated in a processing container by supplying an etching gas. The control device includes: a first acquisition unit configured to acquire, as information, an amount of a film forming material formed on one of the plurality of substrates; a second acquisition unit configured to acquire, as information, the number of the plurality of substrates accommodated in the processing container; a first calculating unit configured to calculate a total amount of the film forming material formed on the plurality of substrates accommodated in the processing container based on the amount of the film forming material acquired by the first acquisition unit and the number of the substrates acquired by the second acquisition unit; and a second calculating unit configured to calculate an etching condition required to etch and remove the entire film forming material based on the total amount of the film forming materials calculated by the first calculating unit and a relationship between a predetermined amount of the film forming material and an etching condition.

An aspect of the present disclosure provides a substrate processing method including an etching process of collectively performing etching processing on a plurality of substrates accommodated in a processing container by supplying etching gas. The etching process includes: a first acquisition step of acquiring, as information, an amount of a film forming material formed on one of the plurality of substrates; a second acquisition step of acquiring, as information, the number of the substrates accommodated in the processing container; a first calculating step of calculating a total amount of the film forming material formed on the plurality of substrates accommodated in the processing container based on the amount of the film forming material acquired by the first acquisition unit and the number of the substrates acquired by the second acquisition unit; and a second calculating step of calculating an etching condition an etching condition required to etch and remove the entire film forming material based on the total amount of the film forming materials calculated by the first calculating unit and a relationship between a predetermined amount of the film forming material and an etching condition.

In the above-described substrate processing method, the etching process further includes an etching step of performing the etching processing on the plurality of substrates accommodated in the processing container based on the etching condition calculated in the second calculating step.

The above-described substrate processing method further includes a film forming process of forming a predetermined film on the plurality of substrates on which the etching processing is performed in the processing container.

According to the disclosed substrate processing system, it is possible to perform end point detection of etching using a gas containing bromine.

Hereinafter, an exemplary embodiment of the present disclosure will be described with reference to the drawings. Further, in the present specification and the drawings, substantially identical configurations are denoted by the same reference numerals, and a repeated description thereof will be omitted.

(Substrate Processing System)

A substrate processing system of the present disclosure will be described. FIG. 1 is a schematic cross-sectional view of a substrate processing system according to an exemplary embodiment of the present disclosure.

As illustrated in FIG. 1, the substrate processing system has a substrate processing apparatus 1 and a control device 2.

The substrate processing apparatus 1 is a batch type apparatus capable of collectively performing, for example, various types of processings such as a film forming processing and an etching processing on a semiconductor wafer (hereinafter, referred to as a "wafer W") which is a substrate.

The control device 2 is, for example, a computer, and has a central processing unit (CPU), a random access memory (RAM), a read only memory (ROM), an auxiliary storage device, and the like. The CPU is operated based on a program stored in the ROM or the auxiliary storage device, and controls an operation of the substrate processing apparatus 1. The control device 2 may be provided inside or outside the substrate processing apparatus 1. In a case in which the control device 2 is provided outside the substrate processing apparatus 1, the control device 2 may control the substrate processing apparatus 1 via a wired or wireless communication unit.

(Substrate Processing Apparatus)

As illustrated in FIG. 1, the substrate processing apparatus 1 according to the exemplary embodiment of the present disclosure has a processing container 10 configured to accommodate therein wafers W.

The processing container 10 includes a cylindrical inner tube 12 having a lower opened end and a ceiling, and a cylindrical outer tube 14 having a lower opened end and a ceiling and configured to cover the outer side of the inner tube 12. The inner tube 12 and the outer tube 14 are made of a heat-resistant material such as, for example, quartz, and coaxially disposed, thereby defining a double tube structure. A wafer boat 16, which holds the plurality of wafers W at predetermined intervals, is loaded into and unloaded from the processing container 10.

The ceiling portion of the inner tube 12 is formed, for example, flat. A nozzle accommodating portion 18 is disposed at one side of the inner tube 12 so as to accommodate gas nozzles in a longitudinal direction (the vertical direction) of the inner tube 12. A part of a sidewall of the inner tube 12 protrudes outward, thereby forming a convex portion 20, and the nozzle accommodating portion 18 is defined inside the convex portion 20. In addition, the sidewall of the inner tube 12 opposite to the nozzle accommodating portion 18, an opening 22 is formed in the longitudinal direction (vertical direction) of the inner tube 12.

The opening 22 is an exhaust port formed to exhaust the gas in the inner tube 12. The length of the opening 22 is equal to the length of the wafer boat 16, or the opening 22 extends in the vertical direction so that the length thereof is larger than the length of the wafer boat 16. That is, the upper end of the opening 22 is located at a height equal to or higher than a position corresponding to the upper end of the wafer boat 16, and the lower end of the opening 22 is located at a height equal to or lower than a position corresponding to a lower end of the wafer boat 16. Specifically, as illustrated in FIG. 1, the distance between the upper end of the wafer boat 16 and the upper end of the opening 22 in the height direction ranges from about 0 mm to about 5 mm. In addition, the distance between the lower end of the wafer boat 16 and the lower end of the opening 22 in the height direction ranges from about 0 mm to about 350 mm. In addition, the width of the opening 22 ranges from about 10 mm to about 400 mm, particularly, from about 40 mm to about 200 mm.

The lower end of the processing container 10 is supported by, for example, a cylindrical manifold 30 made of a stainless steel. A flange portion 32 is formed in the upper end of the manifold 30, and the lower end of the outer tube 14 is installed and supported on the flange portion 32. A seal member 34 such as, for example, an O-ring is interposed between the flange portion 32 and the lower end of the outer tube 14, such that the interior of the outer tube 14 is in a gastight state.

A ring shaped-support portion 36 is provided on the inner wall of an upper portion of the manifold 30, and the lower end of the inner tube 12 is installed on the support portion 36 such that the support portion 36 supports the inner tube 12. A lid 38 is mounted on an opening formed in the lower end of the manifold 30 in a gastight manner through a seal member 40 such as, for example, an O-ring, and the lid 38 is configured to block the opening side in the lower end of the processing container 10, that is, the opening of the manifold 30 in a gastight manner. The lid 38 is made of, for example, a stainless steel.

A rotating shaft 44 is provided in a central portion of the lid 38 through a magnetic fluid seal portion 42. The lower portion of the rotating shaft 44 is rotatably supported on an arm 48 of a lifting unit 46 which is configured as a boat elevator, and the rotating shaft 44 is configured to be rotated by a motor.

A rotating plate 50 is provided in the upper end of the rotating shaft 44, and the wafer boat 16 configured to hold wafers W is placed on the rotating plate 50 through a thermally insulating table 52 made of quartz. Therefore, when the lifting unit 46 moves up and down, the lid 38 and the wafer boat 16 integrally move up and down, and the wafer boat 16 may be loaded into or unloaded from the processing container 10.

A gas supply unit 60 is provided in the manifold 30, and introduces a predetermined gas such as, for example, a processing gas and a purge gas into the inner tube 12. The gas supply unit 60 has a plurality of (for example, three) gas nozzles 62, 64, and 66 which are made of quartz and have different lengths. The respective gas nozzles 62, 64, and 66 are provided in the inner tube 12 in the longitudinal direction of the inner tube 12 and supported such that base ends of the gas nozzles 62, 64, and 66 are bent in an L shape and penetrate the manifold 30.

The gas nozzles 62, 64, and 66 are installed in a row in a circumferential direction in the nozzle accommodating portion 18 of the inner tube 12. In the gas nozzle 62, a plurality of gas holes 62A are formed in the upper portion of the inner tube 12 at predetermined intervals in the longitudinal direction of the gas nozzle 62, and the gas may be ejected in the horizontal direction from the plurality of gas holes 62A. In the gas nozzle 64, a plurality of gas holes 64A are formed in the central portion of the inner tube 12 at predetermined intervals in the longitudinal direction of the gas nozzle 64, and the gas may be ejected in the horizontal direction from the plurality of gas holes 64A. In the gas nozzle 66, a plurality of gas holes 66A are formed in the lower portion of the inner tube 12 at predetermined intervals in the longitudinal direction of the gas nozzle 66, and the gas may be ejected in the horizontal direction from the plurality of gas holes 66A. As described above, the gas may be ejected by the gas nozzles 62, 64, and 66 independently to the upper portion, the central portion, and the lower portion in the inner tube 12.

As the gas, various types of gases such as a film forming gas, an etching gas, and a purge gas are used, and it is possible to supply the gas through the respective gas nozzles 62, 64, and 66 while controlling the flow rates of the gases as necessary. For example, a silicon-containing gas may be used as the film forming gas. For example, a bromine-containing gas such as, for example, hydrogen bromide (HBr) gas may be used as the etching gas. For example, an inert gas such as, for example, nitrogen ($N_2$) gas may be used as the purge gas.

A gas outlet port 70 is formed above the support portion 36 as the sidewall of the upper portion of the manifold 30, such that the gas in the inner tube 12, which is discharged from the opening 22, is discharged through a space portion 72 between the inner tube 12 and the outer tube 14. An exhaust unit 74 is provided in the gas outlet port 70. The exhaust unit 74 has an exhaust passageway 76 connected to the gas outlet port 70. A pressure adjusting valve 78, which is a pressure adjusting unit, and a vacuum pump 80 are sequentially interposed in the exhaust passageway 76 such that the processing container 10 is exhausted to form a vacuum.

A cylindrical heating unit 90 is provided at an outer circumferential side of the outer tube 14 so as to cover the outer tube 14. The cylindrical heating unit is configured to heat the wafers W.

(Control Device)

Figure 2:
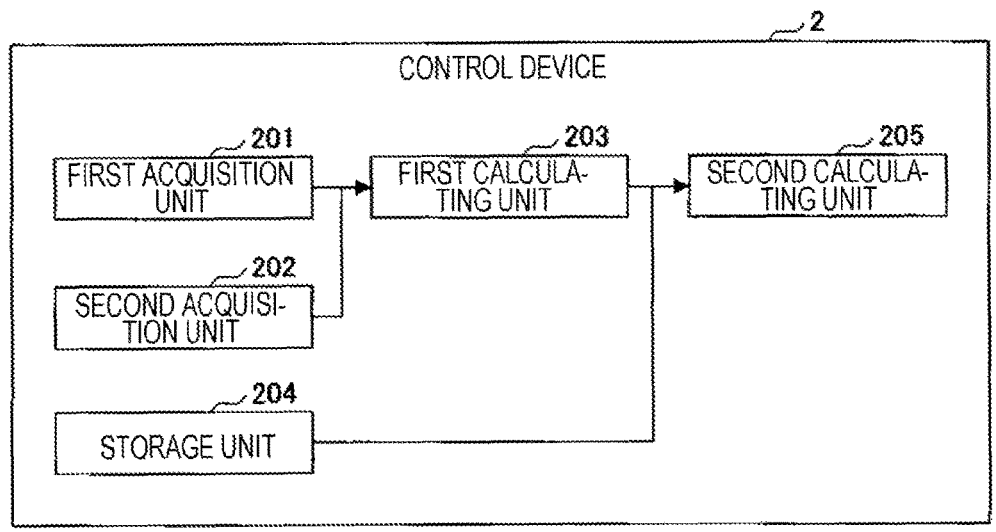
FIG. 2 is a view for explaining a functional configuration of a control device according to the exemplary embodiment of the present disclosure.
Figure 3:
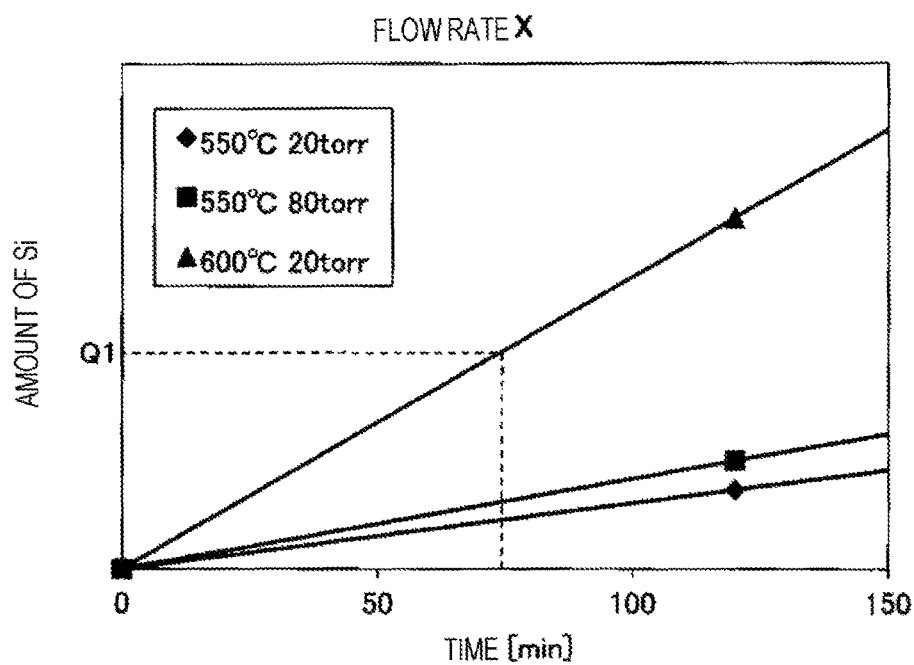
FIG. 3 is a view illustrating a relationship between an amount of Si and an etching time.

The control device 2 according to the exemplary embodiment of the present disclosure will be described. FIG. 2 is a view for explaining a functional configuration of the control device 2 according to the exemplary embodiment of the present disclosure. FIG. 3 is a view illustrating a relationship between the amount of Si and the etching time. In FIG. 3, a vertical axis indicates the amount of Si, and a horizontal axis indicates the etching time (minute).

As illustrated in FIG. 2, the control device 2 has a first acquisition unit 201, a second acquisition unit 202, a first calculating unit 203, a storage unit 204, and a second calculating unit 205.

The first acquisition unit 201 acquires, as information, the amount of Si of a silicon (Si) film formed on one of the plurality of wafers W on which an etching processing is performed in the processing container 10. The amount of Si may be the number of Si atoms included in the Si film formed on one wafer W. For example, the amount of Si may be calculated based on the surface area of a substrate before the Si film is formed on the substrate and the film thickness of the Si film. Specifically, in the case in which the substrate has an unevenness pattern, the surface area of the substrate is increased and the amount of Si is increased in comparison with the case in which the substrate has no unevenness pattern.

The second acquisition unit 202 acquires, as information, the number of the wafers W accommodated in the processing container 10. Specifically, the second acquisition unit 202 acquires, as information, the number of the wafers W accommodated in the processing container 10, for example, based on the number of the wafers W input by an operator or the like or the number of wafers W actually held by the wafer boat 16.

The Si first calculating unit 203 calculates the amount of Si formed on all of the wafers W accommodated in the processing container 10 based on the amount of Si formed on one wafer W which is acquired by the first acquisition unit 201 and the number of the wafers W which is acquired by the second acquisition unit 202. Hereinafter, the amount of Si formed on all of the wafers W accommodated in the processing container 10 is referred to as "the total amount of Si". Specifically, the first calculating unit 203 calculates the total amount of Si, for example, by multiplying the amount of Si formed on one wafer W, which is acquired by the first acquisition unit 201, by the number of sheets of the wafers W which is acquired by the second acquisition unit 202.

The storage unit 204 stores a relationship between the amount of Si and the etching condition. For example, as illustrated in FIG. 3, the relationship between the amount of Si and the etching condition may be a graph indicating a relationship among the amount of Si, processing time of etching processing, processing temperature, and processing pressure which are determined in accordance with a flow rate of etching gas to be supplied into the processing container 10. The relationship between the amount of Si and the etching condition may be determined, for example, based on a preliminary experiment and the like.

The second calculating unit 205 calculates an etching condition required to etch and remove all Si formed on the plurality of wafers W, based on the total amount of Si calculated by the first calculating unit 203 and the relationship between the amount of Si and the etching condition which is stored in the storage unit 204. Specifically, for example, in a case in which the gas flow rate is X, the processing temperature is 550° C., the processing pressure is 20 Torr, and the amount of Si calculated by the first calculating unit 203 is Q1, the second calculating unit 205 calculates the etching time when the amount of Si becomes Q1, based on the relationship illustrated in FIG. 3. In an example illustrated in FIG. 3, the etching time when the amount of Si becomes Q1 is 75 minutes.

(Etching Condition Calculating Process)

Figure 4:
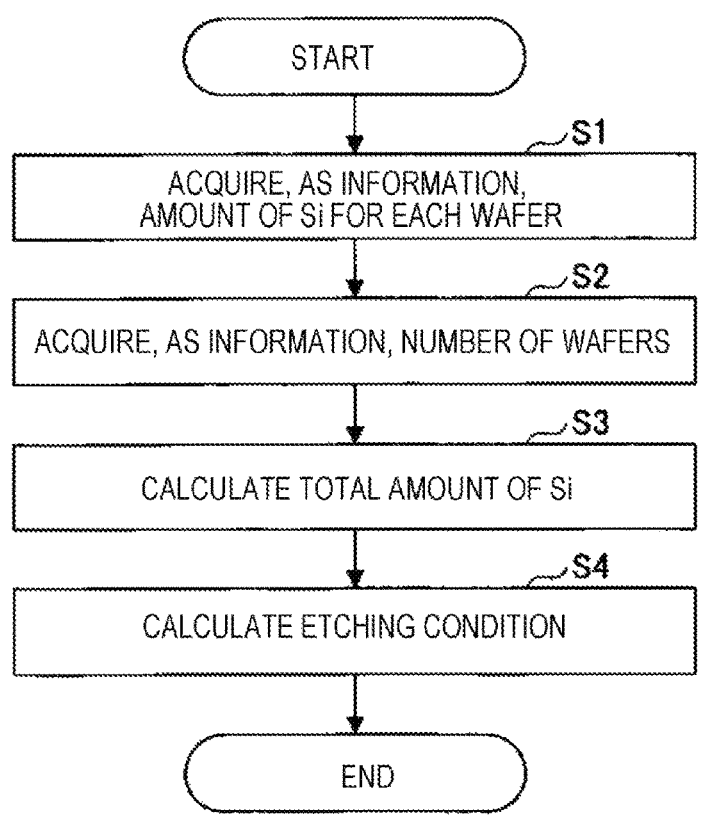
FIG. 4 is a flowchart of an example of an etching condition calculating process according to the exemplary embodiment of the present disclosure.

An etching condition calculating process according to the exemplary embodiment of the present disclosure will be described. FIG. 4 is a flowchart of an example of the etching condition calculating process according to the exemplary embodiment of the present disclosure.

The control device 2 begins to perform the etching condition calculating process illustrated in the flowchart in FIG. 4 when an operation of initiating the etching processing by the operator or the like is received.

In a Si amount acquisition step S1, the first acquisition unit 201 acquires the amount of Si of the Si film formed on one of the plurality of wafers W which are subjected to the etching processing in the processing container 10.

In a sheet number acquisition step S2, the second acquisition unit 202 acquires the number of the wafers W accommodated in the processing container 10.

In an Si amount calculating step S3, the first calculating unit 203 calculates the amount of Si of all of the wafers W accommodated in the processing container 10 based on the amount of Si formed on one wafer W which is acquired by the first acquisition unit 201 and the number of sheets of the wafers W which is acquired by the second acquisition unit 202.

In a condition calculating step S4, the second calculating unit 205 calculates an etching condition required to etch and remove all of the Si films formed on the plurality of wafers W, based on the amount of Si calculated in the Si amount calculating step S3 and the relationship between the amount of Si and the etching condition which is stored in the storage unit 204.

With the Si amount acquisition step S1 to the condition calculating step S4 as described above, it is possible to calculate the etching condition for etching and removing all of the Si films formed on the plurality of wafers W.

(Substrate Processing Method)

A substrate processing method according to the exemplary embodiment of the present disclosure will be described. Hereinafter, an example in which an unnecessary Si film formed on a surface of the wafer W is removed by the etching processing by using the substrate processing apparatus 1 and the film forming processing is subsequently performed by using the same substrate processing apparatus 1 such that an Si film having desired properties is formed will be described.

First, when an operation of performing the substrate processing on a predetermined number of sheets of wafers W is received, the control device 2 controls an operation of the substrate processing apparatus 1 so that the wafers W of which the number is predetermined (for example, 50 to 150) are placed on the wafer boat 16. In addition, the control device 2 calculates the etching condition through the etching condition calculating process.

After the wafers W of which the number is predetermined are placed on the wafer boat 16, the control device 2 controls the operation of the substrate processing apparatus 1 so that the wafer boat 16 is raised from the lower side of the processing container 10 and loaded into the processing container 10 which is set in advance at a predetermined temperature.

After the wafer boat 16 is loaded into the processing container 10, the control device 2 controls the operation of the substrate processing apparatus 1 so that the opening at the lower end of the manifold 30 is closed by the lid 38, and the interior of the processing container 10 is sealed.

Next, the control device 2 adjusts a pressure in the processing container 10, a temperature of the wafer W, and a flow rate of the HBr gas so that the etching condition calculated by the etching condition calculating process is made, and the control device 2 removes the Si film formed on the wafer W by etching the Si film for a predetermined time (etching step). Therefore, it is possible to remove the Si film formed on the wafer W by etching the Si film without supplying surplus HBr gas. For this reason, it is possible to shorten overflow time of the HBr gas, thereby reducing a consumption amount of HBr gas.

After a predetermined etching time has elapsed, the control device 2 controls the operation of the substrate processing apparatus 1 so that the supply of the HBr gas from the gas nozzles 62, 64, and 66 is stopped, $N_2$ gas is supplied into the processing container 10 from the gas nozzles 62, 64, and 66, and the processing container 10 is purged.

Next, the control device 2 supplies silicon-containing gas into the processing container 10 from the gas nozzles 62, 64, and 66, and forms the Si film on the wafer W. In this case, surplus HBr gas is not supplied to the wafer W during the etching process, and as a result, the HBr gas hardly remains on the wafer W. For this reason, it is possible to shorten incubation time in the film forming process, thereby improving productivity.

After the Si film having a predetermined film thickness is formed, the control device 2 controls the operation of the substrate processing apparatus 1 so that the supply of the Si-containing gas from the gas nozzles 62, 64, and 66 is stopped, $N_2$ gas is supplied into the processing container 10 from the gas nozzles 62, 64, and 66, and the processing container 10 is purged.

As described above, the Si film having desired properties may be formed after the unnecessary Si film formed on the wafer W is removed.

In the aforementioned exemplary embodiment, the first acquisition unit 201 is an example of a first acquisition unit, the second acquisition unit 202 is an example of a second acquisition unit, the first calculating unit 203 is an example of a first calculating unit, and the second calculating unit 205 is an example of a second calculating unit. In addition, the Si amount acquisition step is an example of a first acquisition step, the sheet number acquisition step is an example of a second acquisition step, the Si amount calculating step is an example of a first calculating step, and the condition calculating step is an example of a second calculating step. In addition, the silicon film is an example of a film forming material.

In the aforementioned exemplary embodiment, an example in which the control device 2, which controls the operation of the substrate processing apparatus 1, performs the etching condition calculating process has been described, but the present disclosure is not limited thereto. For example, a control device (group controller) or a host computer, which unifies the management of a plurality of devices including the substrate processing apparatus 1, may perform the etching condition calculating process.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing system capable of performing an etching processing collectively on a plurality of substrates accommodated in a processing container by supplying an etching gas, the substrate processing system comprising:
   a first acquisition unit configured to acquire, as information, an amount of a film forming material formed on one of the plurality of substrates;
   a second acquisition unit configured to acquire, as information, the number of the plurality of substrates accommodated in the processing container;
   a first calculating unit configured to calculate a total amount of the film forming material formed on the plurality of substrates accommodated in the processing container based on the amount of the film forming material acquired by the first acquisition unit and the number of the plurality of substrates acquired by the second acquisition unit; and
   a second calculating unit configured to calculate an etching condition required to etch and remove the entire film forming material based on the total amount of the film forming materials calculated by the first calculating unit and a relationship between a predetermined amount of the film forming material and an etching condition.

2. The substrate processing system of claim 1, wherein the amount of the film forming material is an amount calculated based on a surface area of a substrate before the film forming material is formed on the substrate, and a film thickness of the film forming material.

3. The substrate processing system of claim 1, wherein the film forming material is silicon and the etching gas is a bromine-containing gas.

4. The substrate processing system of claim 1, wherein the etching condition includes at least one of a gas flow rate, a processing time, a processing temperature, and a processing pressure.

5. A control device that controls an operation of a substrate processing apparatus capable of performing an etching processing collectively on a plurality of substrates accommodated in a processing container by supplying an etching gas, the control device comprising:
   a first acquisition unit configured to acquire, as information, an amount of a film forming material formed on one of the plurality of substrates;
   a second acquisition unit configured to acquire, as information, the number of the plurality of substrates accommodated in the processing container;
   a first calculating unit configured to calculate a total amount of the film forming material formed on the plurality of substrates accommodated in the processing container based on the amount of the film forming material acquired by the first acquisition unit and the number of the plurality of substrates acquired by the second acquisition unit; and
   a second calculating unit configured to calculate an etching condition required to etch and remove the entire film forming material based on the total amount of the film forming materials calculated by the first calculating unit and a relationship between a predetermined amount of the film forming material and an etching condition.

6. A substrate processing method comprising:
   an etching process of collectively performing an etching processing collectively on a plurality of substrates accommodated in a processing container by supplying an etching gas, the etching process including:
   a first acquisition step of acquiring, as information, an amount of a film forming material formed on one of the plurality of substrates;
   a second acquisition step of acquiring, as information, the number of the plurality of substrates accommodated in the processing container;
   a first calculating step of calculating a total amount of the film forming material formed on the plurality of substrates accommodated in the processing container based on the amount of the film forming material acquired by the first acquisition unit and the number of the plurality of substrates acquired by the second acquisition unit; and
   a second calculating step of calculating an etching condition an etching condition required to etch and remove the entire film forming material based on the total amount of the film forming materials calculated by the first calculating unit and a relationship between a predetermined amount of the film forming material and an etching condition.

7. The substrate processing method of claim 6, wherein the etching process further includes an etching step of performing the etching processing on the plurality of substrates accommodated in the processing container based on the etching condition calculated in the second calculating step.

8. The substrate processing method of claim 7, further comprising:
   a film forming process of forming a predetermined film on the plurality of substrates on which the etching processing is performed in the processing container.

* * * * *